US012088904B2

(12) United States Patent
Han et al.

(10) Patent No.: US 12,088,904 B2
(45) Date of Patent: *Sep. 10, 2024

(54) META-OPTICAL DEVICE AND OPTICAL APPARATUS INCLUDING THE SAME

(71) Applicant: SAMSUNG ELECTRONICS CO., LTD., Suwon-si (KR)

(72) Inventors: Seunghoon Han, Seoul (KR); Hyunsung Park, Suwon-si (KR); Hyeonsoo Park, Seoul (KR); Bongyong Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/207,543

(22) Filed: Jun. 8, 2023

(65) Prior Publication Data
US 2023/0319384 A1 Oct. 5, 2023

Related U.S. Application Data

(63) Continuation of application No. 16/924,973, filed on Jul. 9, 2020, now Pat. No. 11,711,600.

(30) Foreign Application Priority Data

Jun. 16, 2020 (KR) .......................... 10-2020-0073244

(51) Int. Cl.
H04N 23/55 (2023.01)
G02B 1/00 (2006.01)
(Continued)

(52) U.S. Cl.
CPC ............. *H04N 23/55* (2023.01); *G02B 1/002* (2013.01); *G02B 5/286* (2013.01); *H01L 27/14627* (2013.01); *G02B 2207/101* (2013.01)

(58) Field of Classification Search
CPC .... H04N 23/55; H04N 5/2254; H04N 23/698; H04N 23/80; H04N 23/57; G02B 1/002;
(Continued)

(56) References Cited

U.S. PATENT DOCUMENTS 11,711,600 B2* 7/2023 Han ................. H01L 27/14627
348/335
2006/0006485 A1* 1/2006 Mouli ............... H01L 27/14627
257/432

(Continued)

FOREIGN PATENT DOCUMENTS

CN 106932916 A 7/2017
KR 10-2019-0017626 A 2/2019
KR 10-2021-0110150 A 9/2021

Primary Examiner — Abdelaaziz Tissire
(74) Attorney, Agent, or Firm — Sughrue Mion, PLLC

(57) ABSTRACT

Provided is a meta-optical device including a meta-lens including a plurality of nano-structures, a band pass filter configured to transmit light of predetermined wavelengths within an operation wavelength band of the meta-lens, and a spacer layer provided between the meta-lens and the band pass filter to support the plurality of nano-structures and to form a separation distance between the meta-lens and the band pass filter.

20 Claims, 14 Drawing Sheets

Related U.S. Application Data

(60) Provisional application No. 62/871,841, filed on Jul. 9, 2019.

(51) Int. Cl.
*G02B 5/28* (2006.01)
*H01L 27/146* (2006.01)

(58) Field of Classification Search
CPC .. G02B 5/286; G02B 2207/101; G02B 5/288; G02B 27/0944; G02B 27/0988; G02B 27/4233; G02B 27/4244; G02B 27/4294; G02B 13/16; G02B 13/22; G02B 13/0015; G02B 13/02; G02B 2003/0093; G02B 3/00; G02B 5/1871; G02B 13/0085; G02B 13/006; G02B 13/06; H01L 27/14627; H01L 27/14625; H01L 27/14618; H01L 27/14621
See application file for complete search history.

(56) References Cited

U.S. PATENT DOCUMENTS

| | | |
|---|---|---|
| 2006/0066743 A1 | 3/2006 | Onozawa |
| 2007/0164329 A1 | 7/2007 | Toshikiyo |
| 2010/0214456 A1 | 8/2010 | Tokuda |
| 2015/0219806 A1* | 8/2015 | Arbabi ............... G02B 5/1842 29/436 |
| 2015/0381907 A1* | 12/2015 | Boettiger ......... H01L 27/14621 348/164 |
| 2016/0316180 A1 | 10/2016 | Han et al. |
| 2017/0310907 A1* | 10/2017 | Wang .................... G02B 1/041 |
| 2018/0284428 A1 | 10/2018 | Guenter |
| 2019/0049632 A1 | 2/2019 | Shin et al. |
| 2019/0064532 A1* | 2/2019 | Riley, Jr. ............... G02B 6/428 |
| 2020/0150311 A1* | 5/2020 | Zhang .................... G02B 5/204 |
| 2020/0225386 A1* | 7/2020 | Tsai ....................... G02B 1/002 |
| 2022/0206186 A1* | 6/2022 | Chen ...................... G02B 1/002 |
| 2023/0194760 A1* | 6/2023 | Hao ....................... G02B 1/002 359/642 |

\* cited by examiner

META-OPTICAL DEVICE AND OPTICAL APPARATUS INCLUDING THE SAME

CROSS-REFERENCE TO RELATED APPLICATION

This application is a continuation of U.S. application Ser. No. 16/924,973, filed Jul. 9, 2020, which claims the benefit of U.S. Provisional Application No. 62/871,841, filed on Jul. 9, 2019, in the United States Patent and Trademark Office, and claims priority to Korean Patent Application No. 10-2020-0073244, filed on Jun. 16, 2020, in the Korean Intellectual Property Office, the disclosures of which are incorporated herein in their entireties by reference.

BACKGROUND

1. Field

Example embodiments of the present disclosure relate to a meta-optical device with meta-lens and an optical device including the meta-optical device.

2. Description of Related Art

Optical sensors using semiconductor-based sensor arrays are increasingly used in mobile devices, wearable devices, and the Internet of Things.

Miniaturization of these devices is desired, and the demand to realize desired performance with a thin optical lens is increasing. Meanwhile, the refractive power of a refractive lens that adjusts optical performance by using a curvature increases as the radius of curvature decreases. As the radius of curvature decreases, the thickness of a lens in the optical axis direction increases. Therefore, it is difficult to realize a desired performance with a small thickness. Accordingly, there is an attempt to implement a lens with a small thickness by utilizing a sub-wavelength nano-structure.

SUMMARY

One or more example embodiments provide a meta-optical device having various functions by providing a meta-lens.

One or more example embodiments also provide an optical device that employs a meta-optical device for reduced total optical length.

Additional aspects will be set forth in part in the description which follows and, in part, will be apparent from the description, or may be learned by practice of the example embodiments of the disclosure.

According to an aspect of an example embodiment, there is provided a meta-optical device including a meta-lens including a plurality of nano-structures, a band pass filter configured to transmit light of predetermined wavelengths within an operation wavelength band of the meta-lens, and a spacer layer provided between the meta-lens and the band pass filter, the space layer supporting the plurality of nano-structures and providing a separation distance between the meta-lens and the band pass filter.

The meta-lens, the spacer layer, and the band pass filter may be formed integrally on a substrate.

A thickness of the spacer layer may be greater than a center wavelength $\lambda_o$ of the operation wavelength band of the meta-lens and may be smaller than $30\lambda_o$.

The band pass filter may be an infrared cut-off filter.

The band pass filter is a color filter array may include a red filter, a green filter, and a blue filter.

The band pass filter may include any one color filter from among a red filter, a green filter, and a blue filter.

According to another aspect of an example embodiment, there is provided an image capturing apparatus including a lens assembly including one or more refractive lenses, the meta-optical device including a meta-lens including a plurality of nano-structures, a band pass filter configured to transmit light of predetermined wavelengths within an operation wavelength band of the meta-lens, and a spacer layer provided between the meta-lens and the band pass filter, the spacer layer supporting the plurality of nano-structures and providing a separation distance between the meta-lens and the band pass filter, and an image sensor configured to convert an optical image formed by the lens assembly and the meta-optical device into an electrical signal.

A thickness of the spacer layer may be greater than a center wavelength $\lambda_o$ of the operation wavelength band of a meta-lens and may be smaller than $30\lambda_o$.

The meta-lens, the spacer layer, and the band pass filter may be formed integrally on a substrate.

The band pass filter may be an infrared cut-off filter.

The meta-optical device may be provided between the lens assembly and the image sensor.

The substrate may be a cover glass for the image sensor.

The lens assembly may include a lens with a flat surface, and the meta-optical device may be provided on the flat surface.

The band pass filter is a color filter array may include a red filter, a green filter, and a blue filter.

The meta-lens may include a first meta-lens facing the red filter and configured focus red light, a second meta-lens facing the green filter and configured to focus green light, and a third meta-lens facing the blue filter and configured to focus blue light.

The lens assembly may include a first lens assembly facing the first meta-lens, a second lens assembly facing the second meta-lens, and a third lens assembly facing the third meta-lens.

The meta-optical device may be provided between the lens assembly and the image sensor.

The band pass filter may include any one color filter from among a red filter, a green filter, and a blue filter.

In band pass filter, the spacer layer, and the meta-lens may be integrally formed on a substrate.

The meta-optical device may be provided between the lens assembly and the image sensor.

The lens assembly may include a lens with a flat surface, and the meta-optical device may be provided on the flat surface.

BRIEF DESCRIPTION OF THE DRAWINGS

The above and/or other aspects, features, and advantages of certain example embodiments will be more apparent from the following description taken in conjunction with the accompanying drawings, in which.

DETAILED DESCRIPTION

Figure 1:
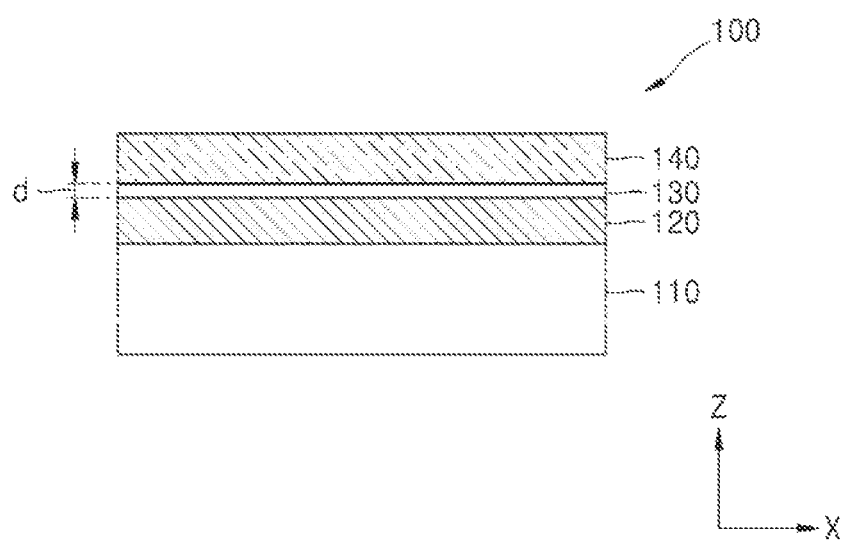
FIG. 1 is a cross-sectional view of a meta-optical device according to an example embodiment.

Example embodiments will now be described with reference to the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, what is described as being "above" or "on" may include not only that which is directly above in contact, but also that which is above in a non-contact manner.

While such terms as "first" and "second" may be used to describe various components, but are used only for the purpose of distinguishing one component from other components. These terms do not limit materials or structures of components.

An expression used in the singular encompasses the expression of the plural, unless it has a clearly different meaning in the context. In addition, unless explicitly described to the contrary, the word "comprise" and variations such as "comprises" or "comprising" will be understood to imply the inclusion of stated elements but not the exclusion of any other elements.

In addition, the terms "unit", "-or", and "module" described in the specification mean units for processing at least one function and operation and may be implemented by hardware components or software components and combinations thereof.

The use of the terms "the" and similar indication words may refer to both singular and plural.

Operations that constitute a method may be performed in any suitable order, unless explicitly stated to be done in an order described. Furthermore, the use of all exemplary terms (e.g., etc.) is merely intended to be illustrative of technical ideas and is not to be construed as limiting the scope of the term unless further limited by the claims.

FIG. 1 is a cross-sectional view of a meta-optical device according to an example embodiment.

A meta-optical device 100 includes a meta-lens 140 and a band pass filter 120. The meta-lens 140 includes a plurality of nano-structures, and the propagation of incident light is controlled according to the shape and the arrangement of the plurality of nano-structures. The detailed configuration of the meta-lens 140 will be described below with reference to FIGS. 2 to 5. The meta-lens 140 may be configured to control incident light with respect to light of a desired wavelength band, and the band pass filter 120 transmits light of some of wavelengths within an operation wavelength band of the meta-lens 140. The band pass filter 120 may be an infrared ray (IR) cut-off filter that transmits visible rays therethrough and blocks IR rays. However, embodiments are not limited thereto. For example, the band pass filter 120 may be an IR pass filter that transmits light of a narrow IR band, for example, light within a wavelength range of ±30 nm around 940 nm. As another example, the band pass filter 120 may be a color filter that transmits light of a specific color. For example, the band pass filter 120 may transmit light of one color from among red, green, and blue and block light of the other colors.

A spacer layer 130 that supports the meta-lens 140 and forms a separation distance between the meta-lens 140 and the band pass filter 120 is provided between the band pass filter 120 and the meta-lens 140. A thickness d of the spacer layer 130 may be greater than a center wavelength λo of the operation wavelength band of the meta-lens 140 and may be smaller than 30 λo. However, embodiments are not limited thereto. For example, d may be greater than λo and smaller than 20 λo, d may be greater than λo and smaller than 10 λo, or d may be greater than λo and smaller than 4 λo.

The meta-lens 140, the spacer layer 130, and the band pass filter 120 may form an integral structure based on one substrate 110. The substrate 110 may include any one of glass (fused silica, BK7, etc.), quartz, polymers (PMMA, SU-8, etc.) and plastics. The band pass filter 120, the spacer layer 130, and the meta-lens 140 may be sequentially formed on the substrate 110. However, embodiments are not limited with regard to the order of these elements. For example, the meta-lens 140, the spacer layer 130, and the band pass filter 120 may be sequentially formed on the substrate 110 in that order. Various processes like deposition, spin-coating, and transfer may be used in the manufacturing process.

Based on the configuration of the meta-optical device 100 according to the example embodiment, the total thickness of the meta-optical device 100 may be minimized to reduce the total optical length of an optical device employing the meta-optical device 100. The meta-lens 140 is proposed to control incident light by utilizing a nano-structure of a sub-wavelength, but it may be difficult to effectively reduce the total thickness of the meta-optical device 100 due to the thickness of a supporting member supporting the meta-lens 140. In the example embodiment, the band pass filter 120 is used as a supporting member of the meta-lens 140. The meta-lens 140 and the band pass filter 120 are the main components of an optical device such as an imaging module. Therefore, the meta-optical device 100 of the example embodiment having a structure in which the meta-lens 140 and the band pass filter 125 are coupled in a minimum thickness may be more efficiently employed in various optical devices.

Although FIG. 1 shows that the band pass filter 120 and meta-lens 140 are arranged on the substrate 110 in the order stated, the present disclosure is not limited thereto, and the band pass filter 125 and meta-lens 140 may be arranged in the order of the meta-lens 140 and the band pass filter 120. The same applies to other embodiments below.

Figure 2:
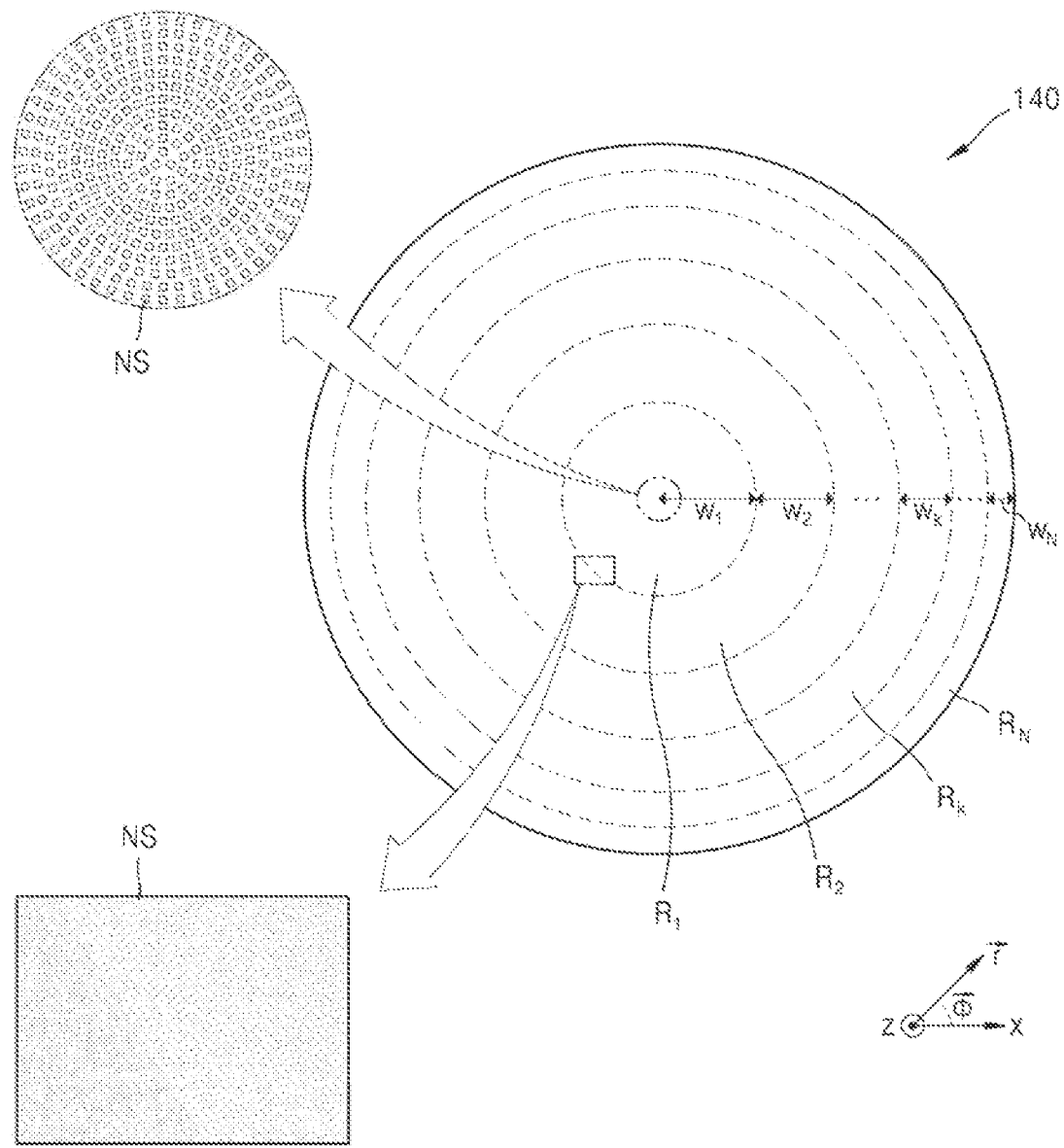
FIG. 2 is a cross-sectional view and a partially enlarged view of an example shape of a meta-lens that may be provided in the meta-optical device of FIG. 1.
Figure 3:
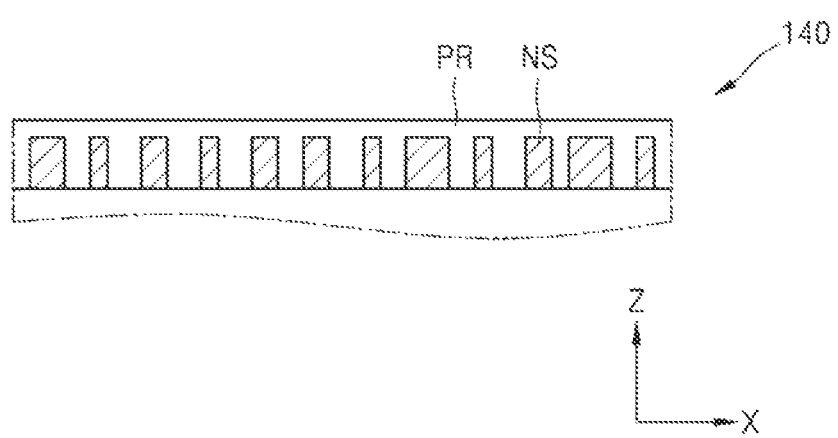
FIG. 3 is a cross-sectional view showing an example shape of a meta-lens provided in the meta-optical device of FIG. 1.
Figure 4A:
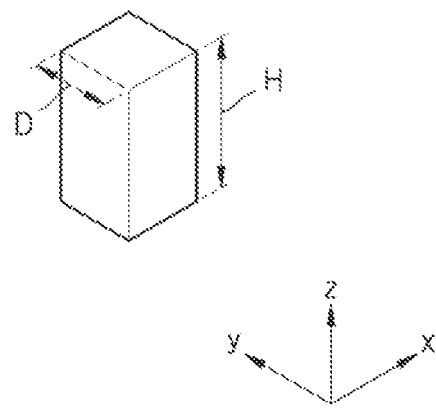
FIGS. 4A and 4B shows example shapes of nano-structures that may be provided in a meta-lens.
Figure 4B:
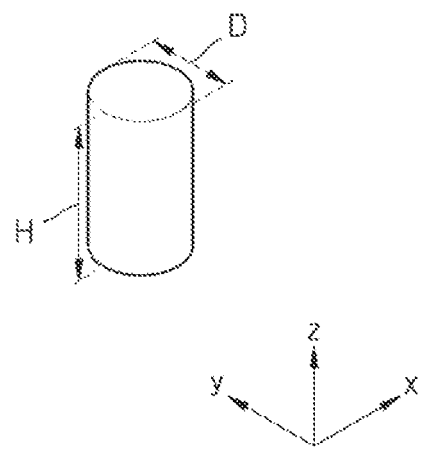

FIG. 2 is a plan view and a partially enlarged view of an example shape of a meta-lens 140 provided in the meta-optical device of FIG. 1, FIG. 3 is a cross-sectional view of an example shape of the meta-lens 140 provided in the meta-optical device of FIG. 1, and FIGS. 4A and 4B shows example shapes of a nano-structure that may be provided in the meta-lens.

The meta-lens 140 includes a plurality of nano-structures NS, and the plurality of nano-structures NS may be two-dimensionally arranged in a radial direction and a circumferential direction. However, embodiments are not limited thereto. For example, plurality of nano-structures NS may be two-dimensionally arranged in a periodic lattice structure. The nano-structures NS may have a sub-wavelength shape dimension. Here, the sub-wavelength may be a shape dimension smaller than the center wavelength $\lambda_o$ of a predetermined wavelength band when the plurality of nano-structures NS are arranged to perform a desired optical function for light in the predetermined wavelength band.

The nano-structure NS may have a rectangular pillar-like shape having a height H and a width D as shown in FIG. 4A or may have a cylindrical shape having the height D and a diameter D as shown in FIG. 4B. The shape of the nano-structure NS is not limited thereto, and may have, for example, a pillar-like shape having various cross-sectional shapes in which a height and a width may be defined. The cross-sectional shape may be a polygonal shape, an elliptical shape, or various other shapes.

The width D of the nano-structure NS may be smaller than the operation wavelength of the meta-lens ML, that is, the center wavelength $\lambda_o$ of the predetermined wavelength band, and the height H of the nano-structure NS may be equal to or greater than the center wavelength $\lambda_o$. The height H of the nano-structure NS may be in a rage of $\lambda_o/2$ to $5\lambda_o$.

The arrangement of the plurality of nano-structures NS may be determined to perform a desired optical function with respect to light in the predetermined wavelength band. For example, the arrangement and shape of the plurality of nano-structures NS may be determined to serve as a lens exhibiting refractive power with respect to light in a wavelength band including visible rays. The wavelength band may be a visible ray wavelength band or a wavelength band including visible rays and IR ray.

The shape of the plurality of nano-structures NS may be represented by a function of a position r of each of the plurality of nano-structures NS, that is, a distance from the center of the meta-lens 140 and an angle φ of rotation between the radial direction and the x-axis. The shape of the nano-structure NS may conform to certain rules, and regions of the meta-lens 140 may be defined according to these rules. Referring to FIG. 2, regions of the meta-lens 140 may be defined as a circular region $R_1$ at the center of the meta-lens 140 and a plurality of ring-like regions $R_2, \ldots R_k \ldots$, and $R_N$ surrounding the circular region wherein the nano-structures NS in the same region may be arranged according to the same rule. The number N of such regions or widths $W_1, \ldots W_k, \ldots$, and $W_N$ may also be major variables in the performance of the meta-lens 140. For example, the number N of regions is related to the magnitude (absolute value) of the refractive power, and the sign of the refractive power may be determined according to the rules within each region. For example, positive refractive power may be implemented by an arrangement according to a rule in which the size of the nano-structures NS decreases along the radial direction in each region, and negative refractive power may be implemented by an arrangement according to a rule in which the size of the nano-structures NS increases along the radial direction in each region.

Also, the shape and the arrangement of the nano-structures NS may be determined in consideration of a wavelength band, aberration correction, etc. The meta-lens 140 may also exhibit optical performance that does not appear in typical refractive lenses, for example, negative Abbe's number characteristics. In this case, the meta-lens 140 may be combined with other refractive lenses to more efficiently correct the chromatic aberration.

As shown in FIG. 3, the nano-structure NS is supported by the spacer layer 130, and may also be covered and protected by a protection layer PR. The protection layer PR may be omitted.

The nano-structure NS may have a high refractive index that differs by 0.5 or more from the refractive index of a surrounding material. The nano-structure NS may include, for example, at least one of c-Si, p-Si, a-Si, group III-V compound semiconductors such as gallium arsenide (GaAs), gallium phosphie (GaP), gallium nitride (GaN), etc., silicon carbide (SiC), tin oxide ($TiO_2$), and silicon nitride (SiN).

The spacer layer 130 and the protection layer PR may include a material having a refractive index smaller than a refractive index of the nano-structure NS. The spacer layer 130 and the protection layer PR may include a material having a relatively low-refractive index, for example, polymer materials like SU-8 and PMMA or materials like silicon dioxide ($SiO_2$) and SOG.

According to an example embodiment, the nano-structure NS may have a low refractive index that differs by 0.5 or more from the refractive index of a surrounding material. The nano-structure NS may include, for example, $SiO_2$ or air. In this case, protection layer PR includes a material that has higher refractive index than the nano-structure NS, for example, at least one of c-Si, p-Si, a-Si, group III-V compound semiconductors such as GaAs, GaP, GaN, GaAs, etc., SiC, $TiO_2$, and SiN. The spacer layer 130 may include a material having a lower refractive index than the protection layer PR, for example, polymer materials like SU-8 and PMMA or materials like $SiO_2$ and SOG.

As such, the nano-structure NS having a difference in refractive index from surrounding materials may change the phase of light passing through the nano-structure NS. This is due to a phase delay caused by the sub-wavelength shape dimension of the nano-structures NS, and the degree of the phase delay depending on the detailed shape dimension and the arrangement shape of the nano-structures NS. Various optical functions may be achieved by appropriately setting the degree of a phase delay occurring in each of the plurality of nano-structures NS.

Figure 5:
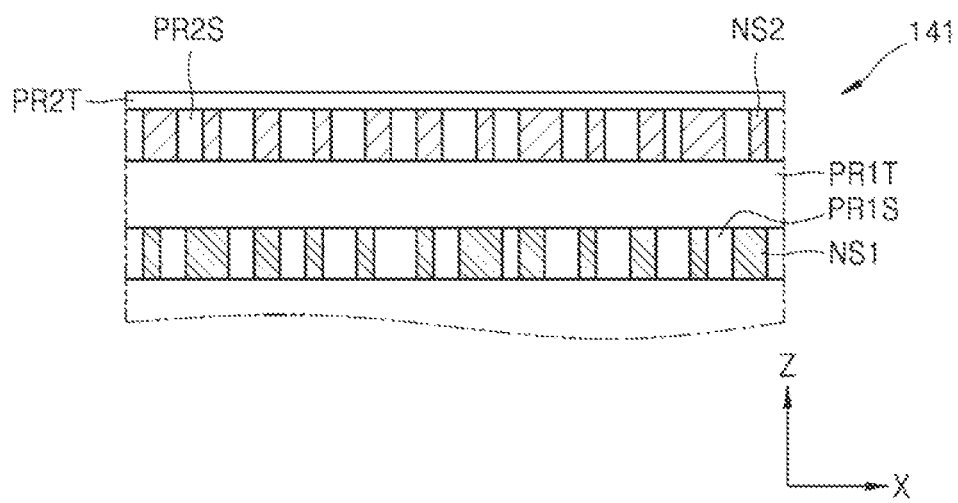
FIG. 5 is a cross-sectional view showing an example shape of a meta-lens according to another example embodiment that may be provided in the meta-optical device of FIG. 1.

FIG. 5 is a cross-sectional view showing an example shape of a meta-lens according to another example embodiment that may be provided in the meta-optical device of FIG. 1.

A meta-lens 141 may include nano-structures NS1 and NS2 arranged in a two-layer structure. A plurality of nano-structures NS1 and a protection layer PR1S form a first layer, a protection layer PR1T is formed over the plurality of nano-structures NS1, and a plurality of nano-structures NS2 may be arranged on the protection layer PR1T and form a second layer. The protection layer PR1S and the protection layer PR1T may be formed of a same material. The plurality of nano-structures NS2 and a protection layer PR2S form the second layer, and a protection layer PR2T may be further formed over the plurality of nano-structures NS2. The protection layer PR2S and the protection layer PR2T may be formed of a same material. The protection layer PR2S and the protection layer PR2T may be omitted. This multiple layer structure may be used for more detailed control of the function of the meta-lens 141. The shape and the arrangement of the plurality of nano-structures NS1 of the first layer, the shape and the arrangement of the plurality of nano-structure NS2 of the second layer, and the number of multiple layers may be detailed parameters for controlling performance. In other words, according to such a multi-layer structure, various variables causing interactions between adjacent nano-structures become available, and thus desired optical performances, such as focal length, operation wavelength and bandwidth, and aberration correction, may be implemented.

Figure 6:
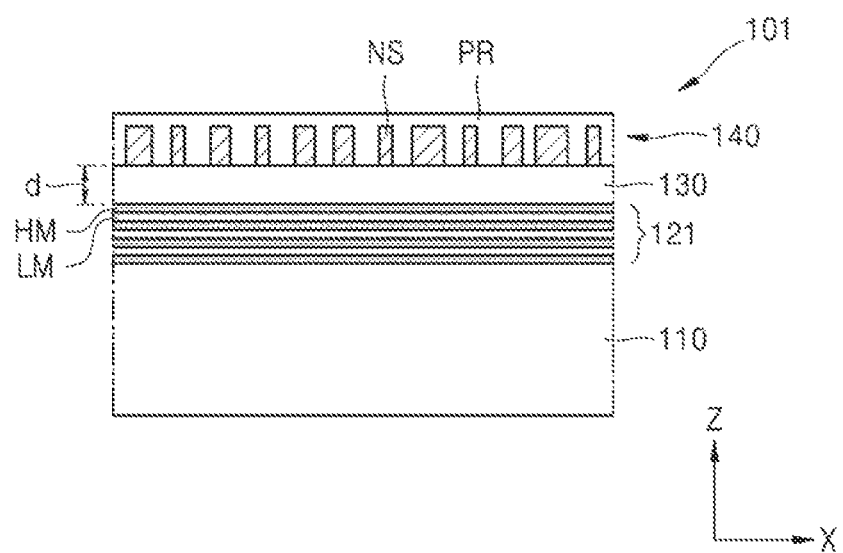
FIG. 6 is a cross-sectional view of a meta-optical device according to another example embodiment.

FIG. 6 is a cross-sectional view of a meta-optical device according to another example embodiment.

A meta-optical device 101 includes the substrate 110, a band pass filter 121, the spacer layer 130, and the meta-lens 140.

The band pass filter 121 may have a structure in which a low refractive material layer LM and a high refractive material layer HM are alternately stacked. The high refractive material layer HM may include SiN, Si, TiO, GaAs, GaP, GaN, etc., whereas the low refractive material layer LM may include $SiO_2$, SOG, SU-8, etc. The thickness of each layer or the number of repetitively arranged layers may be set in consideration of the wavelength band and the filter efficiency.

A thickness d of the spacer layer 130 may be greater than a center wavelength λo of the operation wavelength band of the meta-lens 140 and may be smaller than 30 λo. However, embodiments are not limited thereto. For example, d may be greater than λo and smaller than 20 λo, or d may be greater than λo and smaller than 10 λo.

Figure 7:
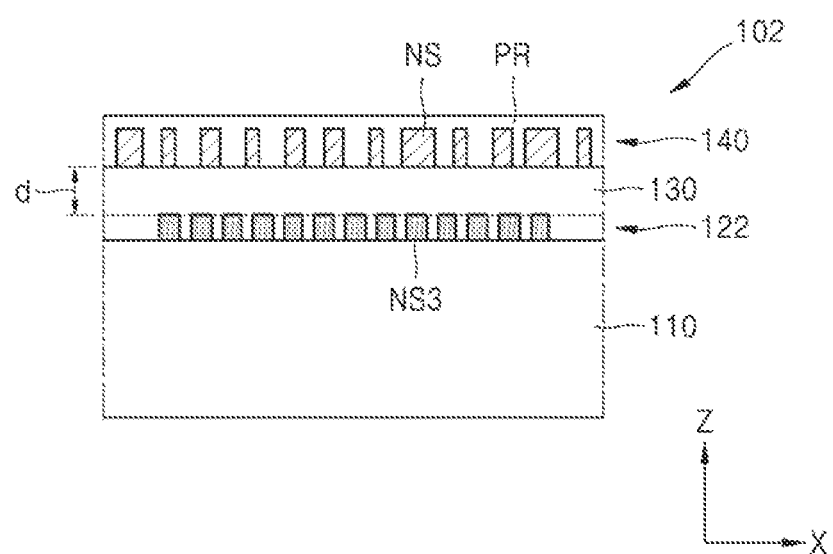
FIG. 7 is a cross-sectional view of a meta-optical device according to another example embodiment.

FIG. 7 is a cross-sectional view of a meta-optical device according to another example embodiment.

A meta-optical device 102 includes the substrate 110, a band pass filter 122, the spacer layer 130, and the meta-lens 140.

The band pass filter 122 may include a plurality of nano-structures NS3 including a material having a refractive index higher than that of a surrounding material. A nano-structure NS3 may include SiN, Si, TiO, GaAs, GaP, GaN, etc. The shape of the nano-structure NS3 may have a dimension smaller than a center wavelength of a transmission wavelength band of the band pass filter 122.

A thickness d of the spacer layer 130 may be greater than a center wavelength λo of the operation wavelength band of the meta-lens 140 and may be smaller than 30 λo. However, embodiments are not limited thereto. For example, d may be greater than λo and smaller than 20 λo, d may be greater than λo and smaller than 10 λo, or d may be greater than λo and smaller than 4 λo.

Figure 8:
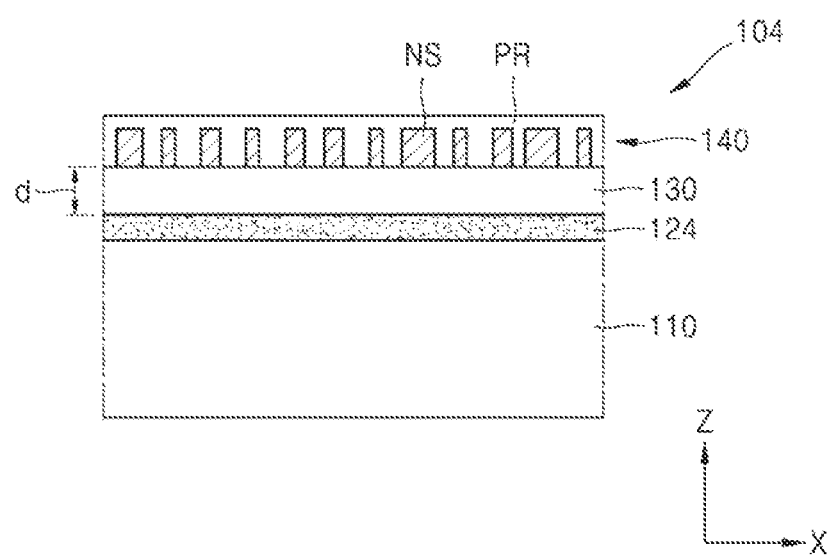
FIG. 8 is a cross-sectional view of a meta-optical device according to another example embodiment.

FIG. 8 is a cross-sectional view of a meta-optical device according to another example embodiment.

A meta-optical device 104 includes the substrate 110, a band pass filter 124, the spacer layer 130, and the meta-lens 140.

The band pass filter 124 may include inorganic material. The band pass filter 124 may be a color filter including dye material that that transmits light of a predetermined color and absorbs light of another color.

Although FIGS. 6, 7 and 8 show that meta-optical devices 101, 102 and 104 include the meta-lens 140 in which the nano-structures NS are arranged in a single layer, embodiments are not limited thereto. For example, the meta-lens 141 of FIG. 5 in which nano-structures are arranged in multiple layers may be provided. Also, meta-lens having a multiple layer structure including three or more layers may be employed.

Figure 9:
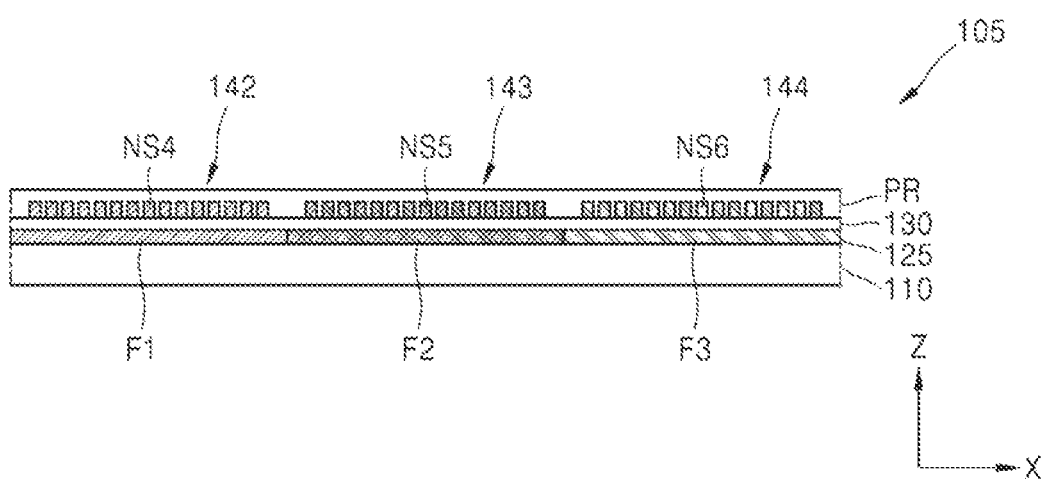
FIG. 9 is a cross-sectional view of a meta-optical device according to another example embodiment

FIG. 9 is a cross-sectional view of a meta-optical device according to another example embodiment.

A meta-optical device 105 includes the substrate 110, a color filter array 125, the spacer layer 130, and meta-lenses 142, 143, and 144.

The color filter array 125 includes a red filter F1 for transmitting light in the red wavelength band, a green filter F2 for transmitting light in the green wavelength band, and a blue filter F3 for transmitting light in the blue wavelength band. A first meta-lens 142 is placed at a position facing the red filter F1, a second meta-lens 143 is placed at a position facing the green filter F2, and a third meta-lens 144 is placed at a position facing the blue filter F3.

The shapes and the arrangements of nano-structures NS4, NS5, and NS6 provided in the first meta-lens 142, the second meta-lens 143, and the third meta-lens 144 may be configured to focus the red wavelength band, the green wavelength band, and the blue wavelength band, respectively.

The meta-optical device described above may be employed in various electronic devices.

Figure 10:
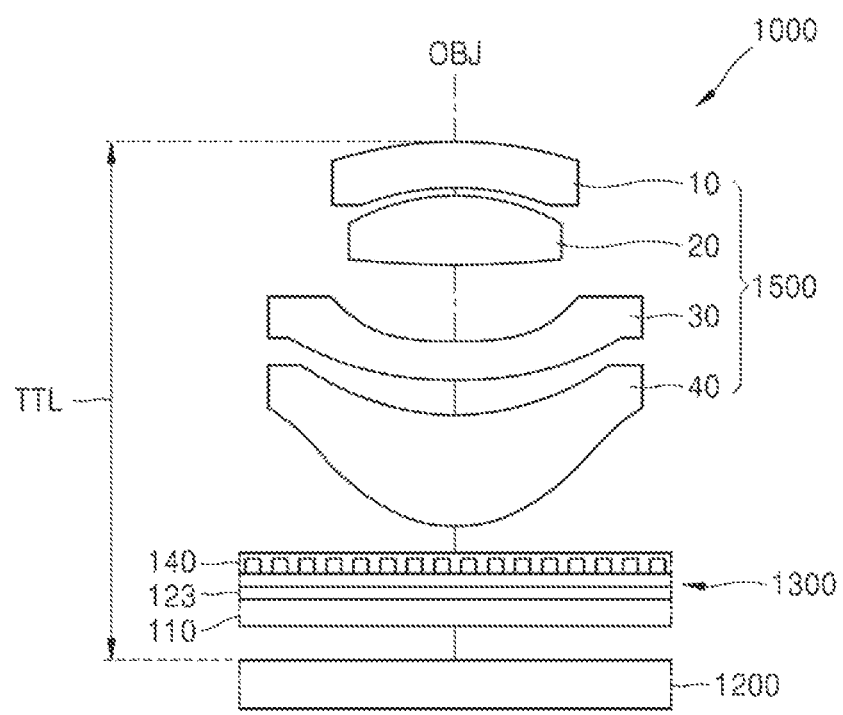
FIG. 10 is a diagram an optical arrangement of an image capturing apparatus according to an example embodiment.

FIG. 10 is a diagram showing an optical arrangement of an image capturing apparatus according to an example embodiment.

An image capturing apparatus 1000 includes lens assembly 1500, a meta-optical device 1300, and an image sensor 1200.

The lens assembly 1500 include one or more refractive lenses. A refractive lens refers to a lens having at least one curved surface and exhibiting refractive power. The curved surface may be spherical or aspherical. As shown in FIG. 9, the lens assembly 1500 may include four lenses 10, 20, 30, and 40. However, the number and the shapes of lenses and shown in FIG. 9 are merely examples.

The meta-optical device 1300 includes the substrate 110, a band pass filter 123, the spacer layer 130, and the meta-lens 140. The band pass filter 123 may be an IR cut-off filter. The meta-lens 140 may be configured to correct aberrations of the lens assembly 1500 and have a predetermined focal length together with the lens assembly 1500.

The image sensor 1200 converts an optical image of an object OBJ formed by the lens assembly 1500 and the meta-lens 140 into an electrical signal. The image sensor 1200 is placed at a position of an image plane where an optical image of the object OBJ is formed by the lens assembly 1500 and meta-lens 140. The image sensor 1200 may include an array of charge-coupled devices (CODs), complementary metal oxide semiconductors (CMOS), photodiodes, etc. that sense light and generate electrical signals. However, the image sensor 1200 is not limited thereto.

The substrate 110 of the meta-optical device 1300 not only supports the band pass filter 123 and the meta-lens 140, but may also function as a cover glass protecting the image sensor 1200. In this regard, the meta-optical element 1300 supplements the performance of the lens assembly 1500 and minimizes the total optical length TTL of the image capturing apparatus 1000. For example, if substrates 110 are separately provided for the band pass filter 123 and the meta-lens 140 and a separate cover glass for protecting the image sensor 1200 is provided, then the total optical length TTL becomes significantly longer than the total optical length TTL shown in FIG. 9. The optical device 1000 according to the example embodiment employs the meta-optical device 1300 in which the substrate 110 that functions as a supporting member for the band pass filter 123 and the meta-lens 140, and also as a cover glass for the image sensor 1200, and thus the total optical length TTL may be more effectively reduced.

Figure 11:
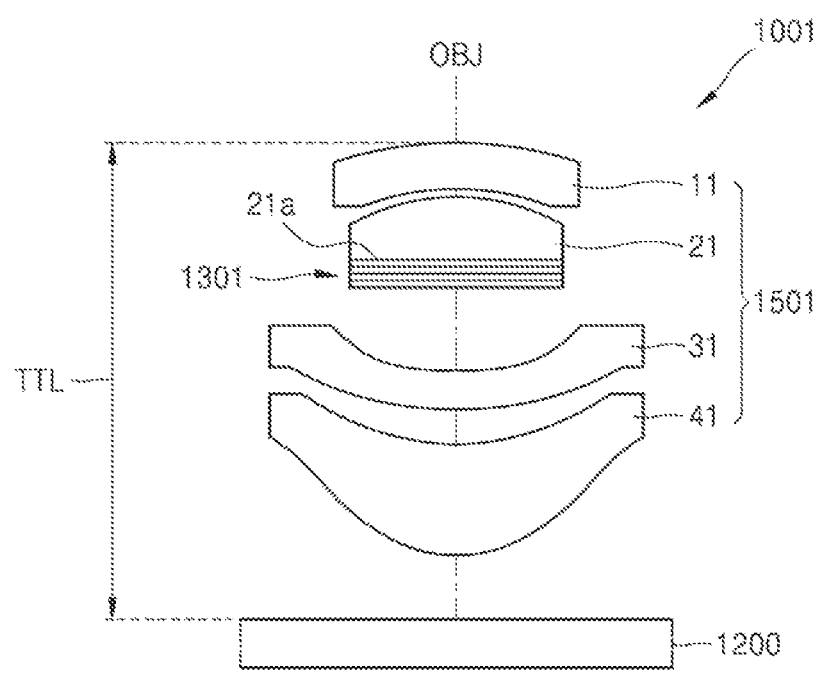
FIG. 11 is a diagram an optical arrangement of an image capturing apparatus according to another example embodiment.

FIG. 11 is a diagram showing an optical arrangement of an image capturing apparatus according to another example embodiment.

An image capturing apparatus 1001 of the example embodiment is different from the image capturing apparatus 1000 of FIG. 10 in the configuration of lens assembly 1501 and a position of a meta-optical device 1301.

The image capturing apparatus 1001 includes lens assembly 1501, the meta-optical device 1301, and the image sensor 1200. The lens assembly 1501 may include a lens having one flat surface. For example, one surface 21a of a second lens 21 from among four lenses 11, 21, 31, and 41 constituting the lens assembly 1501 may be a flat surface, and the meta-optical device 1301 may be provided on the one surface 21a. The meta-optical device 1301 may be similar to the meta-optical device 1300 shown in FIG. 10 in that the meta-optical device 1301 includes a meta-lens and a band pass filters. However, since the positions thereof are different from those shown in FIG. 10, the detailed design of the meta-lens provided in the meta-optical device 1301 may be different from the meta-lens provided in the meta-optical device 1300. The band pass filter provided in the meta-optical device 1301 may be an IR cut-off filter.

The direction in which the meta-optical device 1301 is provided on the one surface 21a of the lens 21 is not particularly limited. The substrate of the meta-optical device 1301 or a protection layer of the meta-lens may be in contact with the one surface 21a.

Since the meta-optical device 1301 is placed in a space between two lenses 21 and 31, the total optical length TTL of the image capturing apparatus 1001 may be more effectively reduced. The position of the meta-optical device 1301 is merely an example and may be placed on another flat lens surface within the lens assembly 1501.

Although FIGS. 10 and 11 show examples in which the meta-optical devices 1300 and 1301 include IR cut-off filters, embodiments are not limited thereto. For example, an IR pass filter through which IR within a predetermined wavelength range, for example, the wavelength range of 940 nm±30 nm, is transmitted may be provided. The image capturing apparatuses 1000 and 1001 may be utilized as apparatuses for obtaining visible ray images when IR cut-off filters are provided and may be utilized as apparatuses for obtaining IR images when IR pass filters are provided.

Figure 12:
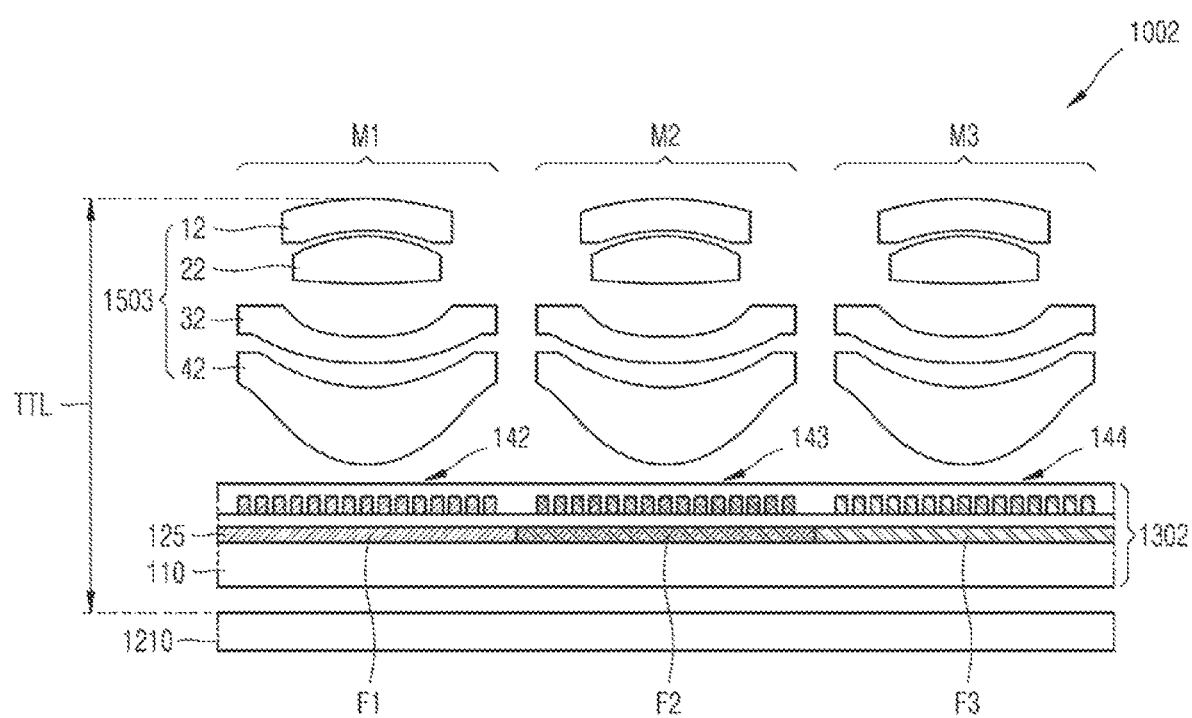
FIG. 12 is a diagram an optical arrangement of an image capturing apparatus according to another example embodiment.

FIG. 12 is a diagram showing an optical arrangement of an image capturing apparatus according to another example embodiment.

An image capturing apparatus 1002 includes a plurality of lens assembly 1503, a meta-optical device 1302, and the image sensor 1200.

The meta-optical device 1302 is substantially the same as the meta-optical device 105 shown in FIG. 9. The meta-optical device 1002 includes a color filter array 125 and includes the first meta-lens 142 facing the red filter F1, the second meta-lens 143 facing the green filter F2, and the third meta-lens 144 facing the blue filter F3.

The plurality of lens assembly 1503 are arranged to face the first meta-lens 142, the second meta-lens 143, and the third meta-lens 144, respectively, and constitute a red imaging module M1, a green imaging module M2, and a blue imaging module M3, respectively. A plurality of sets of such imaging modules M1, M2, and M3 may be provided and repeatedly arranged.

The substrate 110 of the meta-optical device 1302 not only supports the color filter array 125 and meta-lenses 142, 143, and 144, but may also function as a cover glass protecting the image sensor 1210. In this regard, the meta-optical element 1302 supplements the performance of the lenses 1503 and minimizes the total optical length TTL of the image capturing apparatus 1000. For example, if substrates 110 are separately provided for the color filter array 125 and the meta-lenses 142, 143, and 144 and a separate cover glass for protecting the image sensor 1210 is provided, then the total optical length TTL becomes significantly longer than the total optical length TTL shown in FIG. 11. The optical device 1002 according to the example embodiment employs the meta-optical device 1302 in which the substrate 110 that functions as a supporting member for the color filter array 125 and the meta-lenses 142, 143, and 144 and also as a cover glass for the image sensor 1210, and thus the total optical length TTL may be more effectively reduced.

Figure 13:
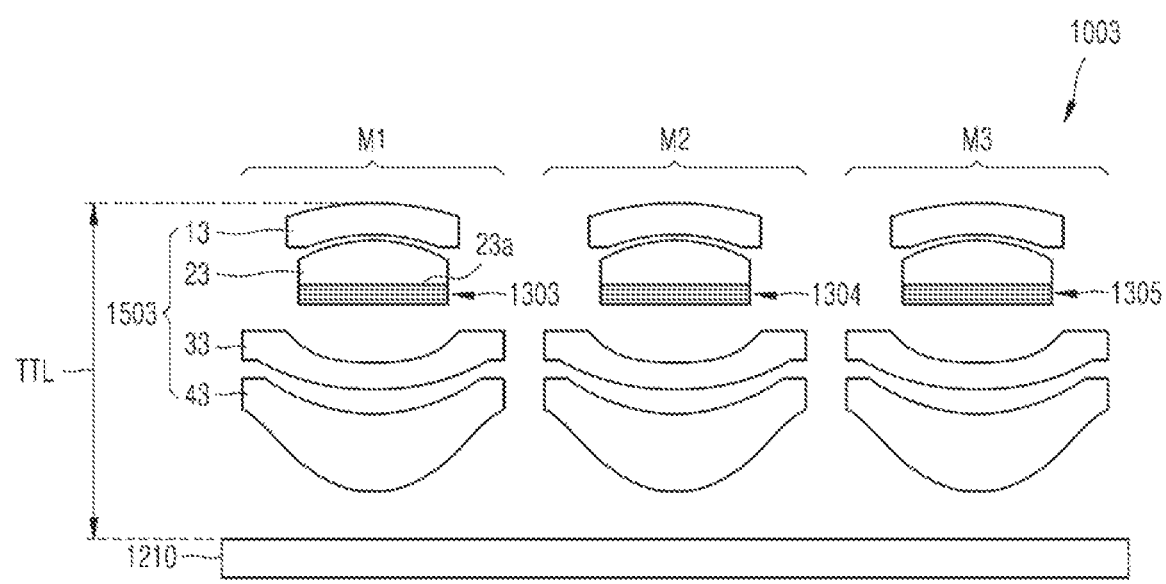
FIG. 13 is a diagram showing an optical arrangement of an image capturing apparatus according to another example embodiment.

FIG. 13 is a diagram showing an optical arrangement of an image capturing apparatus according to another embodiment.

An image capturing apparatus 1003 includes the plurality of lens assembly 1503, meta-optical devices 1303, 1304, and 1305, and the image sensor 1210.

A meta-optical device 1303 includes a red filter and first meta-lens designed appropriately for red light. A meta-optical device 1304 includes a green filter and a second meta-lens designed appropriately for green light, and a meta-optical device 1305 includes a blue filter and a third meta-lens designed appropriately for blue light.

The meta-optical devices 1303, 1304, and 1305 are arranged in the plurality of lens assembly 1503 and are arranged on one surface 23a of a second lens 23, respectively as shown in FIG. 13.

The direction in which the meta-optical devices 1303, 1304, and 1305 are arranged on the one surface 23a of the lens 23 is not particularly limited. The substrate of the meta-optical devices 1303, 1304, or 1305, or a protection layer of meta-lenses may be in contact with the one surface 23a.

Since the meta-optical devices 1303, 1304, and 1305 are placed in a space between two lenses 23 and 33, the total optical length TTL of the image capturing apparatus 1003 may be more effectively reduced. The position of the meta-optical devices 1303, 1304, and 1305 is merely an example and may be placed on another flat lens surface within the lens assembly 1503.

The image capturing apparatuses 1000, 1001, 1002, and 1003 shown in FIGS. 10 to 13, may further include a memory, a processor, an actuator, an illumination unit, and a display. An actuator may drive lenses to change their position and adjust a separation distance between lenses, for example, for zooming and/or auto-focusing (AF). An illumination unit may irradiate visible rays and/or IR to an object. A processor may process a signal from an image sensor and also control an overall image capturing apparatus, and may control the driving of the actuator or the illumination unit. Codes or data needed for execution of the processor may be stored in a memory, and an image formed by the image capturing apparatus may be displayed on a display.

A meta-optical device as described above and an image capturing apparatus having the same may be mounted in various electronic devices. For example, a meta-optical device as described above and an image capturing apparatus having the same may be mounted in an electronic device such as a smart phone, a wearable device, an Internet of Things (I) device, augmented reality (AR) glass, virtual reality (VR) headset, a home appliance, a tablet personal computers (PC), a personal digital assistant (PDA), a portable multimedia player (PMP), a navigation device, a drone, an advanced drivers assistance system (ADAS), etc.

Although aspects of the example embodiments are described with reference to the accompanying drawings, they are merely examples, and one of ordinary skill in the art will understand that various modifications and other equivalent embodiments may be derived therefrom. Therefore, the example embodiments should be considered in terms of explanation, not limitation. The scope of the present specification is shown in the claims rather than the foregoing description, and all differences within the equivalent range should be interpreted as being included.

A meta-optical device as described above according to example embodiments may transmit light in a specific wavelength band and change the spatial distribution of transmitted light into a desired shape.

A meta-optical device as described above according to example embodiments may be combined with a lens assembly having a general refractive lens to exhibit desired performance while reducing a total optical length.

A meta-optical device as described above according to example embodiments may be employed in various optical devices such as an image capturing apparatus.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the drawings, it will be understood by those of ordinary skill in the art that various changes in form and details may be made therein without departing from the spirit and scope as defined by the following claims.

What is claimed is:

1. A meta-optical device comprising:
a meta-lens comprising a plurality of nano-structures arranged in a two-layer structure;
a band pass filter configured to transmit light of predetermined wavelengths within an operation wavelength band of the meta-lens;
a spacer layer provided between the meta-lens and the band pass filter, the spacer layer supporting the plurality of nano-structures and providing a separation distance between the meta-lens and the band pass filter; and
a refractive lens having a flat surface and a curved surface, wherein the plurality of nano-structures are disposed on the flat surface of the refractive lens.

2. The meta-optical device of claim 1, wherein the two-layer structure includes a first layer and a second layer on the first layer,
wherein the first layer comprises a plurality of first nano-structures and a first protection material between the plurality of first nano-structures, and the second layer comprises a plurality of second nano-structures.

3. The meta-optical device of claim 2, wherein a first protection layer further provided over the plurality of first nano-structures, between the first layer and the second layer.

4. The meta-optical device of claim 3, wherein the first protection material and the first protection layer include a same material.

5. The meta-optical device of claim 2, wherein the second layer further comprises a second protection material between the plurality of second nano-structures.

6. The meta-optical device of claim 2, wherein the plurality of first nano-structures and the plurality of second nano-structures are different in at least in one of shape and arrangement.

7. The meta-optical device of claim 1, wherein the band pass filter comprises a plurality of third nano-structures.

8. The meta-optical device of claim 1, wherein the meta-lens, the spacer layer, and the band pass filter are integrally formed on a substrate.

9. The meta-optical device of claim 1, wherein a thickness of the spacer layer is greater than a center wavelength $\lambda o$ of the operation wavelength band of the meta-lens and is smaller than 30 $\lambda o$.

10. The meta-optical device of claim 1, wherein the band pass filter is an infrared cut-off filter.

11. The meta-optical device of claim 1, wherein the band pass filter is a color filter array comprising a red filter, a green filter, and a blue filter.

12. The meta-optical device of claim 1, wherein the band pass filter comprises at least one of a red filter, a green filter, and a blue filter.

13. An image capturing apparatus comprising:
a lens assembly comprising a refractive lens that has a flat surface and a curved surface;
a meta-optical device comprising:
a meta-lens comprising a plurality of nano-structures arranged in a two-layer structure;
a band pass filter configured to transmit light of predetermined wavelengths within an operation wavelength band of the meta-lens; and
a spacer layer provided between the meta-lens and the band pass filter, the spacer layer supporting the plurality of nano-structures and providing a separation distance between the meta-lens and the band pass filter; and an image sensor configured to convert an optical image formed by the lens assembly and the meta-optical device into an electrical signal,
wherein the plurality of nano-structures are disposed on the flat surface of the refractive lens.

14. The image capturing apparatus of claim 13, wherein the two-layer structure includes a first layer and a second layer on the first layer,
wherein the first layer comprises a plurality of first nano-structures and a first protection material between the plurality of first nano-structures, and the second layer comprises a plurality of second nano-structures.

15. The image capturing apparatus of claim 14, wherein a first protection layer further provided over the plurality of first nano-structures, between the first layer and the second layer.

16. The image capturing apparatus of claim 13, wherein the band pass filter comprises a plurality of third nano-structures.

17. The image capturing apparatus of claim 13, wherein the lens assembly comprises a first refractive lens and a second refractive lens and the meta-optical device provided between the first refractive lens and the second refractive lens.

18. The image capturing apparatus of claim 17, wherein the meta-optical device is integrally formed on one of the first refractive lens and the second refractive lens.

19. An image capturing apparatus comprising:
a lens assembly comprising a first refractive lens and a second refractive lens, the first refractive lens having a flat surface and a curved surface;
a meta-optical device comprising:
  a meta-lens comprising a plurality of nano-structures;
  a band pass filter configured to transmit light of predetermined wavelengths within an operation wavelength band of the meta-lens; and
  a spacer layer provided between the meta-lens and the band pass filter, the spacer layer supporting the plurality of nano-structures and providing a separation distance between the meta-lens and the band pass filter; and
an image sensor configured to convert an optical image formed by the lens assembly and the meta-optical device into an electrical signal,
wherein the meta-optical device provided between the first refractive lens and the second refractive lens, and
wherein the plurality of nano-structures are disposed on the flat surface of the first refractive lens.

20. The image capturing apparatus of claim 19, wherein the meta-optical device is integrally formed on one of the first refractive lens and the second refractive lens.

* * * * *